(12) United States Patent
DeGraw et al.

(10) Patent No.: US 8,039,314 B2
(45) Date of Patent: Oct. 18, 2011

(54) METAL ADHESION BY INDUCED SURFACE ROUGHNESS

(75) Inventors: Danielle L. DeGraw, Hyde Park, NY (US); Peter James Lindgren, Essex Junction, VT (US); Da-Yuan Shih, Poughkeepsie, NY (US); Ping-Chuan Wang, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 367 days.

(21) Appl. No.: 12/185,259

(22) Filed: Aug. 4, 2008

(65) Prior Publication Data

US 2010/0025825 A1 Feb. 4, 2010

(51) Int. Cl.
*H01L 21/00* (2006.01)
(52) U.S. Cl. ........ 438/113; 438/114; 438/462; 438/667; 257/E21.239
(58) Field of Classification Search .................. 438/113, 438/114, 462, 465, 667; 257/E21.239, E21.577, 257/E21.584
See application file for complete search history.

(56) References Cited

U.S. PATENT DOCUMENTS

| 4,952,904 | A | 8/1990 | Johnson et al. |
| 5,998,292 | A | 12/1999 | Black et al. |
| 6,078,068 | A | 6/2000 | Tamura |
| 6,188,120 | B1 | 2/2001 | Andricacos et al. |
| 6,734,090 | B2 | 5/2004 | Agarwala et al. |
| 6,803,309 | B2 * | 10/2004 | Chou et al. ............... 438/653 |
| 7,163,883 | B2 | 1/2007 | Agarwala et al. |
| 7,195,952 | B2 * | 3/2007 | Vinn et al. ................ 438/108 |
| 7,211,834 | B2 * | 5/2007 | Sunachi et al. .............. 257/99 |
| 2003/0199179 | A1 | 10/2003 | Dozier, II et al. |
| 2006/0220249 | A1 | 10/2006 | Johnston et al. |
| 2006/0278254 | A1 * | 12/2006 | Jackson ...................... 134/21 |
| 2007/0231963 | A1 * | 10/2007 | Doan et al. ................. 438/107 |

\* cited by examiner

*Primary Examiner* — Tuan N. Quach
(74) *Attorney, Agent, or Firm* — John A. Jordan

(57) ABSTRACT

Back side metal (BSM) delamination induced by chip dicing of silicon wafers is avoided by roughening the polished silicon surface at chip edges by etching. The Thru-Silicon-Via (TSV) structures used in 3D chip integration is masked at the back side from roughening to maintain the polished surface at the TSV structures and, thus, reliable conductivity to the BSM layer.

18 Claims, 10 Drawing Sheets

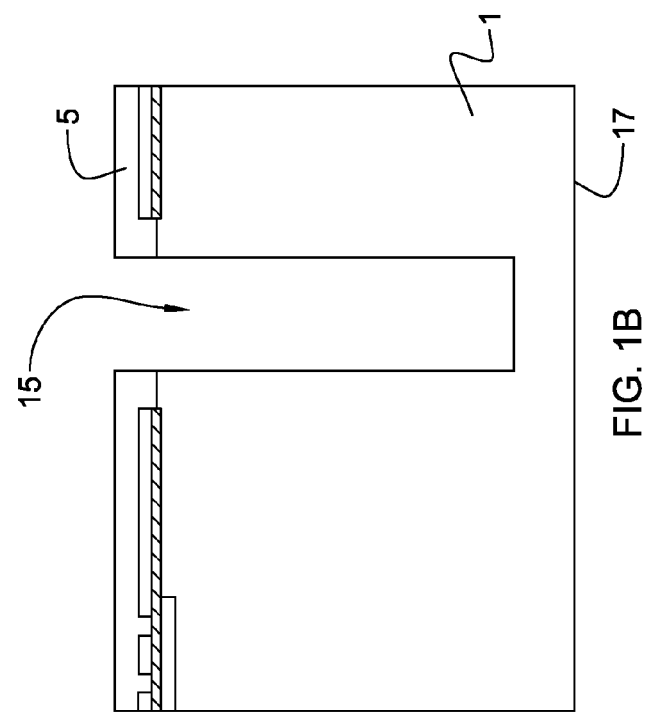
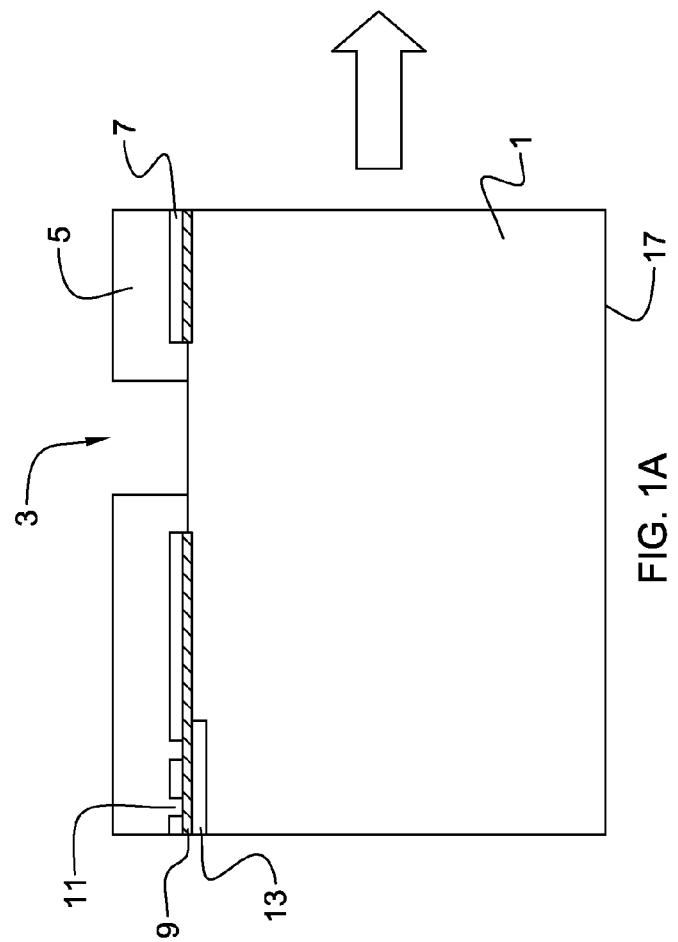

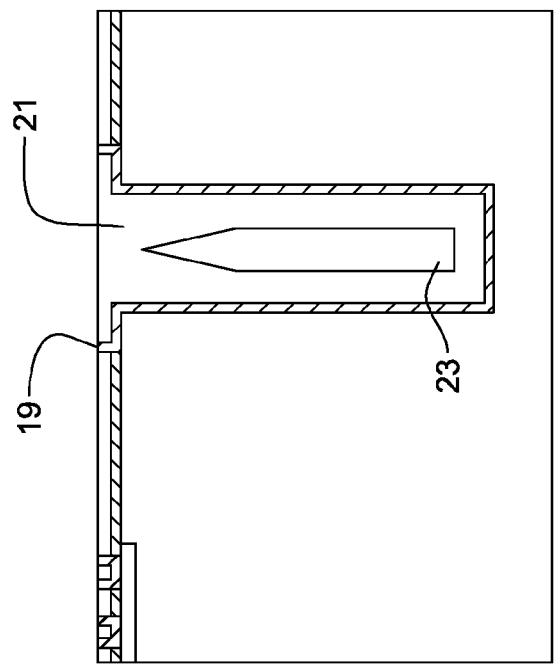
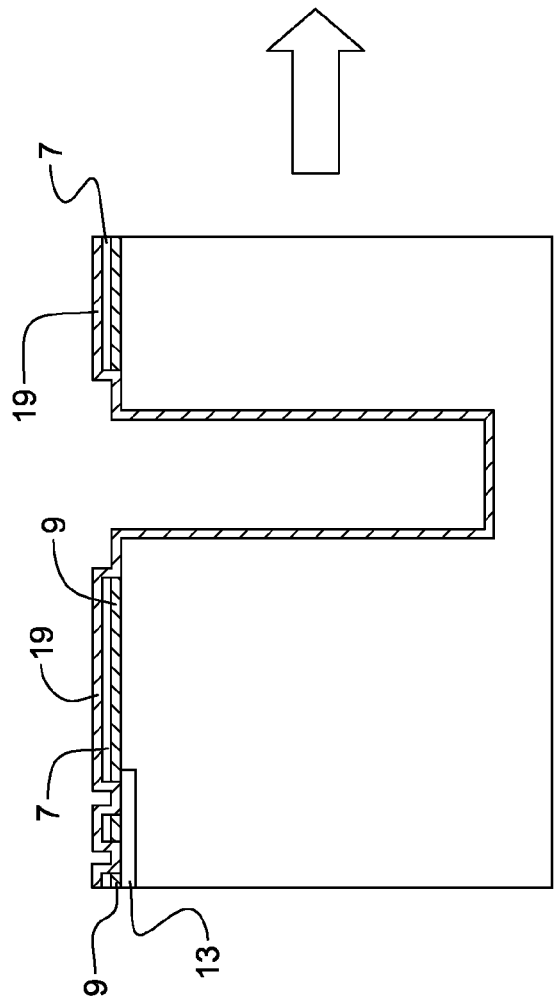

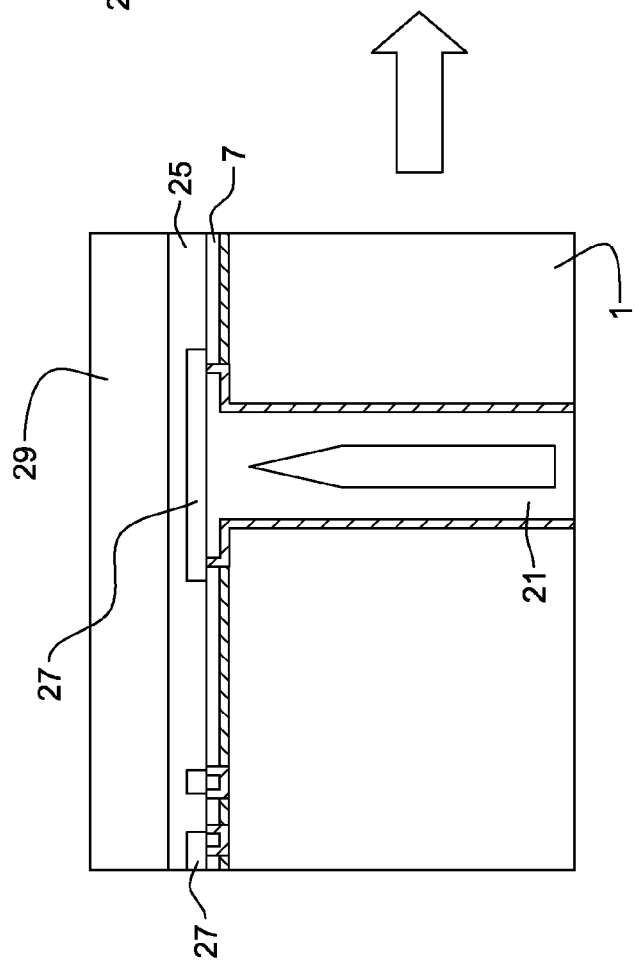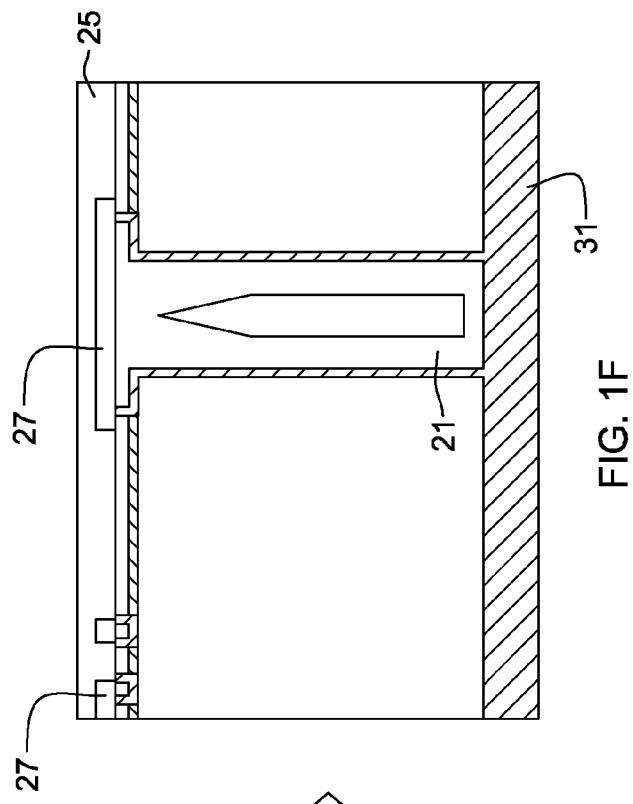

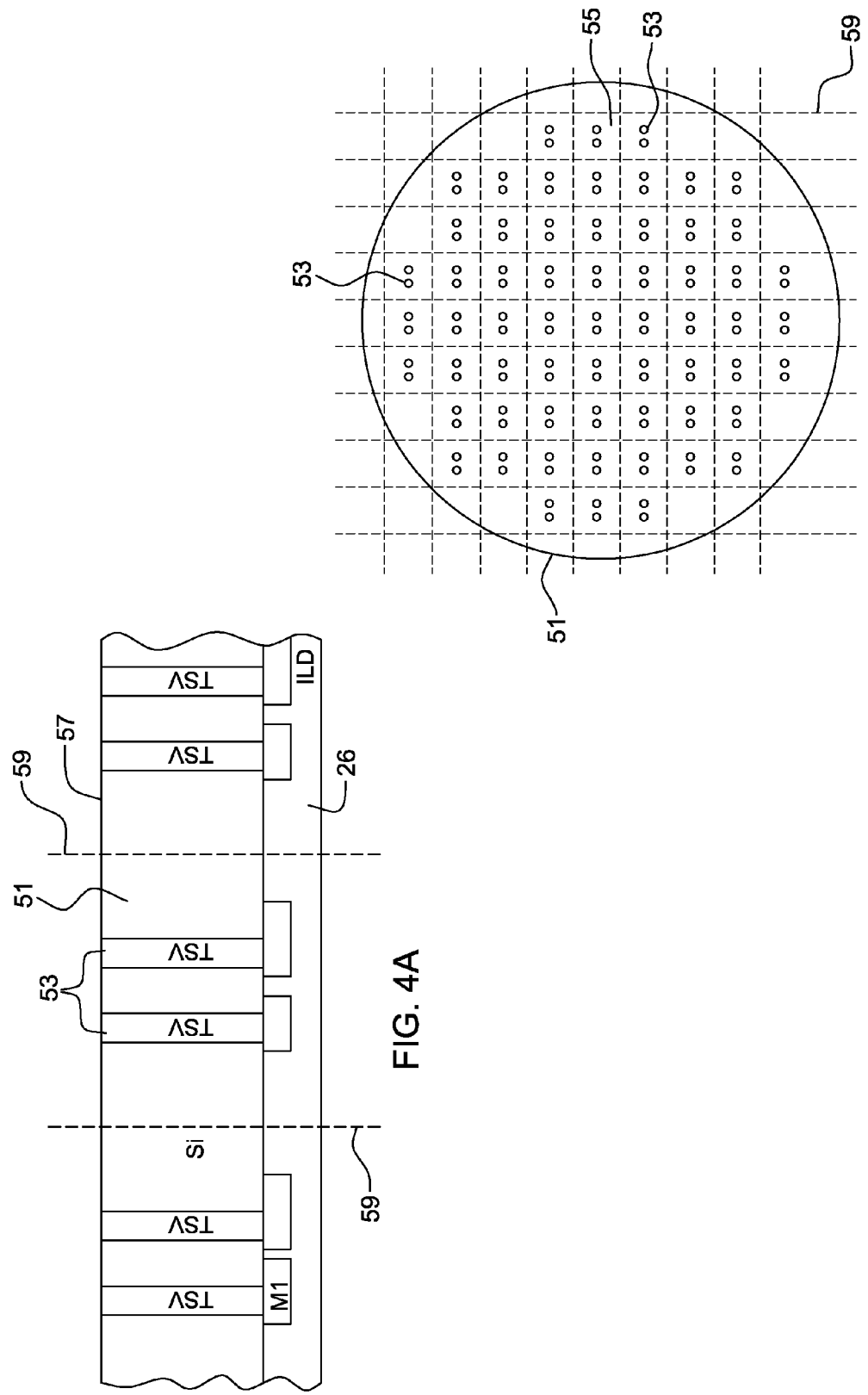

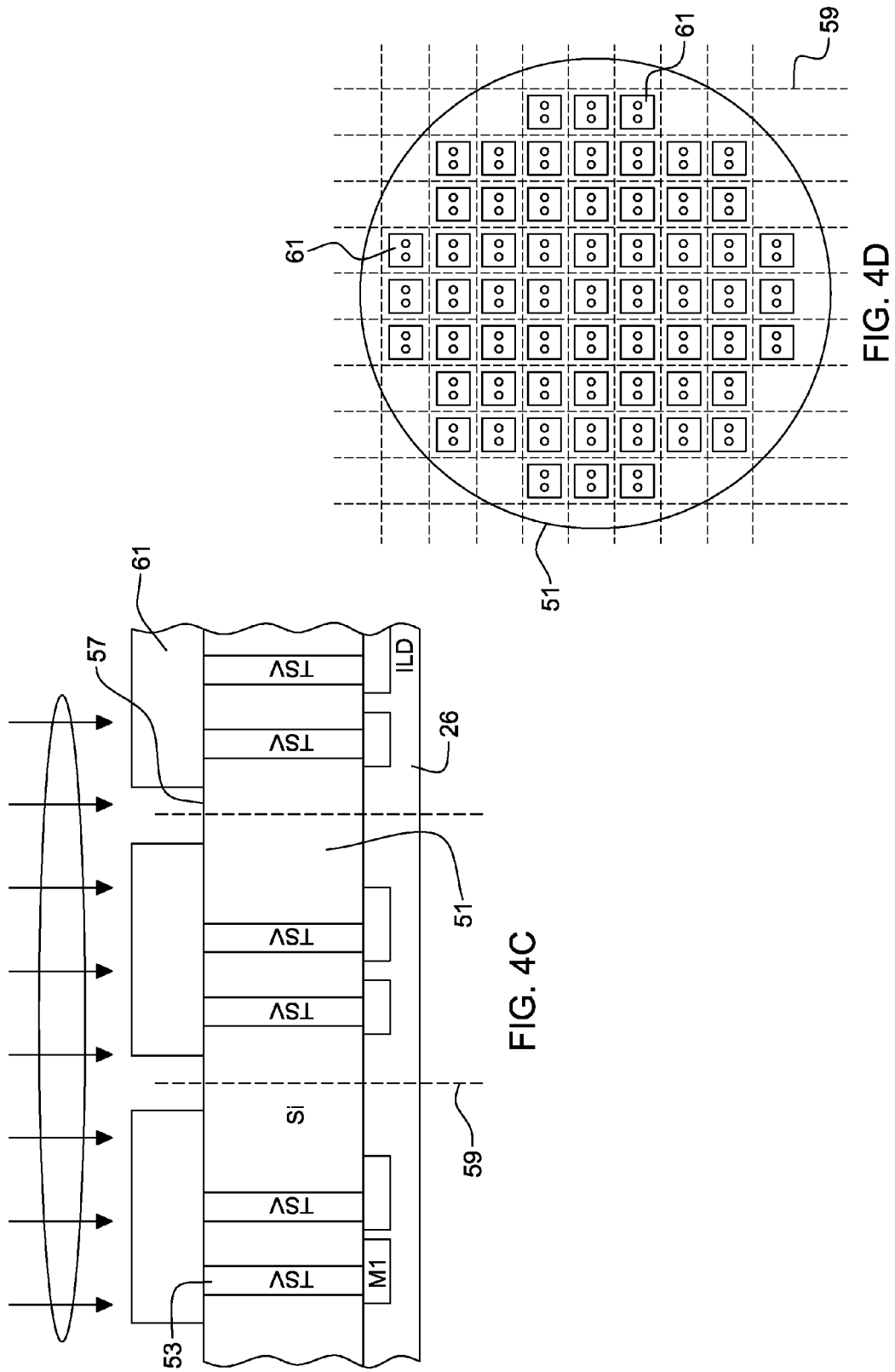

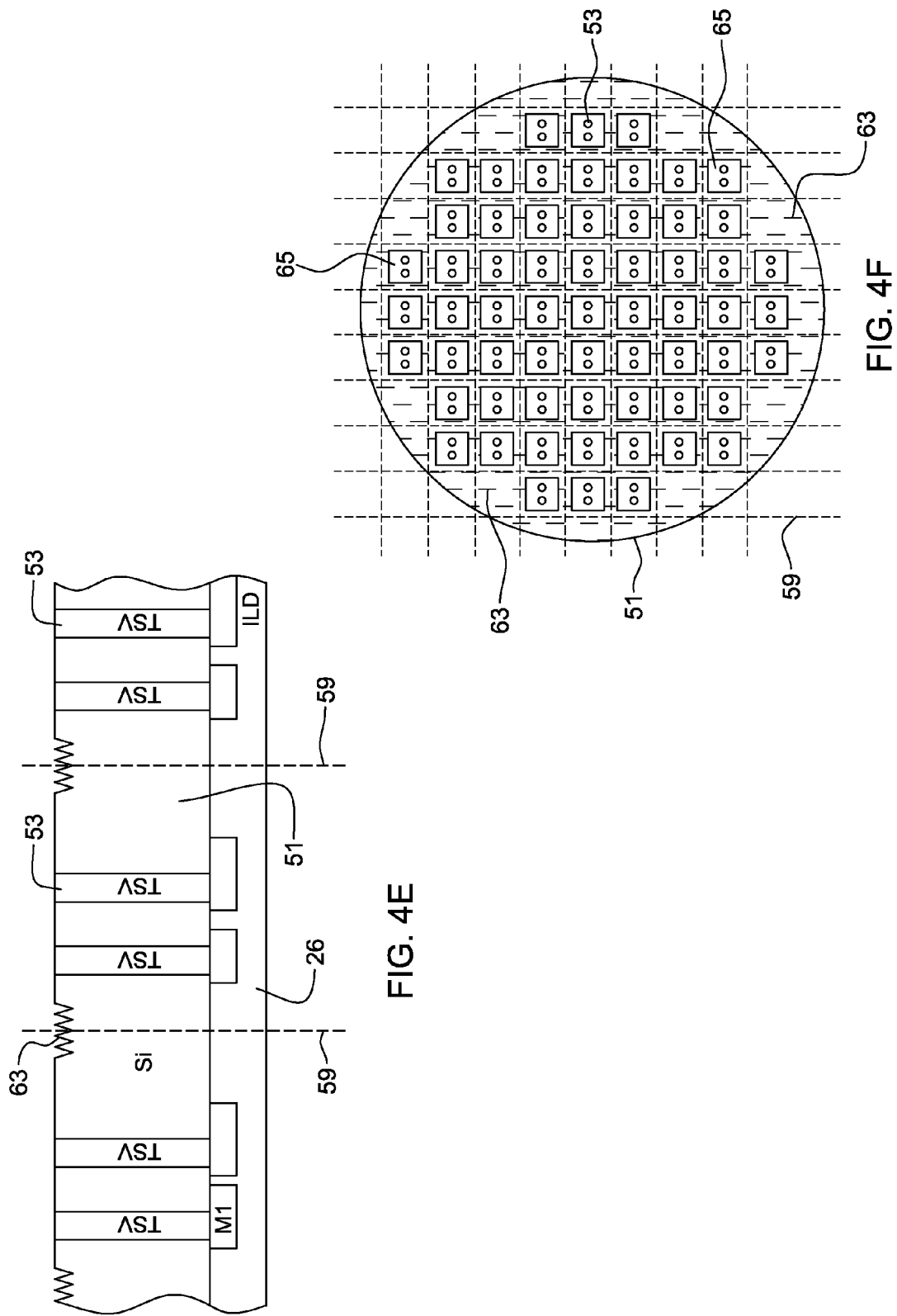

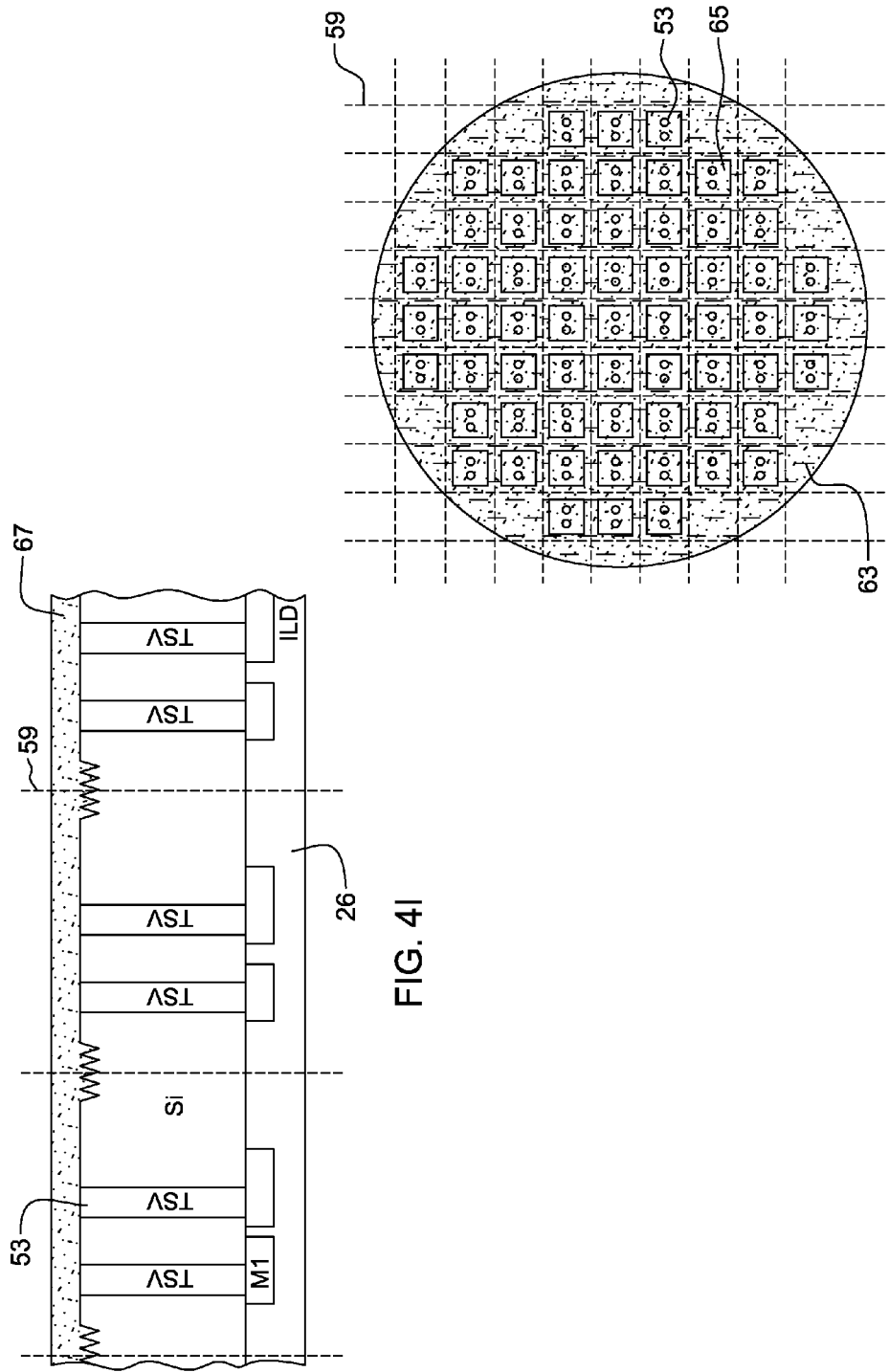

METAL ADHESION BY INDUCED SURFACE ROUGHNESS

BACKGROUND OF THE INVENTION

1. Field of the Invention

The present invention relates to metal adhesion in back side metal (BSM), as used, for example, in 3D chip integration and to the electrically interconnecting via structures, such as, Thru-Silicon-Via (TSV) structures used to carry electrical signals vertically through the semiconductor die. More particularly, the present invention relates to the BSM contact made to the semiconductor wafer and the exposed TSV structures extending to the bottom of the wafer.

2. Background and Related Art

In the packaging of electronic devices, such as, semiconductor chips and wafers, or semiconductor chip carriers, vertical interconnection to the next packaging level, whether it be a chip carrier or chip, may be achieved by Thru-Silicon-Vias (TSV). One prior art approach to creating conductive vias in semiconductor material, such as a silicon semiconductor wafer, is to use what might be called a "via first" approach. The general steps in such an approach are etching the vias, forming insulation layers on the via walls and metallization. When a "blind via" approach is used, the vias are not etch through the wafer so that a "thru-via" is rendered only after the carrier is suitably thinned to expose the via bottoms. An example of such an approach may be found in U.S. Pat. No. 5,998,292. FIGS. 1A-F, as described herein, generally disclose a process that may be used in the "blind via" approach.

One of the difficulties encountered in forming the back side metallurgy that makes electrical contact with the via exposed after thinning is forming reliable electrical contact structure. Reliable electrical contact structures often require multiple layers of metal to be formed at the wafer level. For example, one layer is used to provide good adhesion to the back side of the wafer and via, a second layer may be used on top of the adhesion layer to provide good conductivity and a third layer may be used as a barrier layer against diffusion of the second layer to the surface. A fourth layer may be used for oxidation/corrosion prevention. It is clear, however, that other multi-layer metallurgy arrangements may be used to form BSM layer.

However, it has been found that after the wafer is diced into chips, the BSM layer tends to delaminate from the semiconductor material, such as, silicon, at the chip edges. Such delamination at the chip edges may be on the order of 1 mm which creates serious reliability problems considering the typical chip size is on the order of millimeters.

It has also been found that chip dicing induced delamination is substantially reduced, if not eliminated, where the BSM is deposited after wafer grinding without going though polishing process steps first. It is thus thought that the surface roughness resulting from the wafer grinding process promotes adhesion between the silicon surface and BSM layer.

On the other hand, it is understood that a rough BSM/TSV interface at the bottom of the TSV may create mechanical and ohmic contact integrity problems which will affect electrical performance and reliability of the TSV interconnection structure.

SUMMARY OF THE PRESENT INVENTION

In accordance with the present invention, a BSM contact structure on a wafer back side whether it be a single layer or multilayer, and method of making such contact structure, is provided so as to prevent delamination between the BSM layer and silicon after dicing of the wafer and yet maintain the integrity of the TSV electrical interconnection. To achieve this end, the back side of the silicon is polished and then roughened along the wafer dicing lines away from the TSV before BSM deposition. The roughened silicon surface promotes adhesion of the BSM to the silicon surface at the chip edges but does not affect the integrity of the STV structure since the STV structure and region surrounding it remain polished. Such an arrangement may be used on any of a variety of types of multilayer metal structures.

It is, therefore, an object of the present invention to provide an improved electronic structure and method for fabricating same.

It is a further object of the present invention to provide an improved BSM contact to the back side of a chip and its conductive thru-via structure, and method of making same.

It is yet a further object of the present invention to provide improved metal contact structure to the back side of the silicon surface of a Thru-Silicon-Via (TSV) wafer structure and a method of making such improved metal contact structure.

It is yet still a further object of the present invention to provide a multilayer metal electrical contact structure arranged as the BSM of a wafer that effectively contacts conductive TSV's and yet maintains adhesion at the chip edges after dicing the wafer.

It is yet still another object of the present invention to provide a method of forming metal on semiconductor wafers so as to limit delamination of the metal at chip edges caused by wafer dicing.

These, as well as other objects, are achieved in the present invention by forming the BSM layer of a semiconductor wafer on roughened silicon surface along the lines of dicing and adjacent area but away from the TSV region so that the BSM layer has good adhesion along the lines of dicing so as to thereby avoid delamination upon dicing. Since the silicon surface area around the TSVs remains polished, the contact surface of the TSVs maintains its integrity.

More particularly, the present invention provides a method for preventing a layer of metal from delaminating from a semiconductor surface by providing a layer of semiconductor material having opposing surfaces with at least one through structure via extending to at least one of said opposing surfaces; providing a roughened surface region on said at least one of said opposing surfaces beyond said at least one through via structure to promote adhesion of said layer of material to said at least one of said opposing surfaces; and forming said layer of material on said at least one of said opposing surfaces.

As further provided by the present invention, the above method wherein said layer of semiconductor material is a semiconductor wafer having an array of chips each having said at least one via structure extending to said at least one surface and said step of providing a roughened surface region is carried out along chip dicing lines of said wafer beyond said vias.

As still further provided by the present invention, the above method wherein said layer of material is a layer of metal and said at least one through via structure and vicinity thereof within the perimeter of said roughened surface region is polished.

As yet still further provided by the present invention, the above method wherein said at least one of said opposing surfaces is polished and said step of providing a roughened surface region is carried out by forming masks over at least said at least one through via structure and vicinity thereof leaving said chip dicing lines exposed and exposing said chip dicing lines to a roughening agent.

As further provided by the present invention, the method wherein the said at least one of said opposing surfaces is roughened throughout and said at least one through via structure and vicinity thereof is polished by forming masks over said roughened surface region along said chip dicing lines leaving said at least one through via structure and vicinity exposed and exposing said roughened surface of said at least one through via structure and vicinity thereof to a polishing agent.

As still further provided by the present invention, the above method wherein said step of exposing said chip dicing lines to a roughening agent include exposing said chip dicing lines to reactive ion etching and wherein said reactive ion etching is followed by wet etching.

As yet still further provided by the present invention, the above method wherein said layer of metal is formed with gaps in said metal between said chips along said chip dicing lines of said wafer.

In another embodiment, a method is employed for improving metal adhesion in chip fabrication by providing a silicon wafer having an array of chip regions each having integrated circuits formed at one surface and at least one thru-silicon-via structure extending from said one surface to a smooth surface of the other surface thereof with said at least one thru-silicon-via structure at least partially filled with a conductive material extending to the said smooth surface of said other surface thereof of said silicon wafer; forming a mask pattern on the said smooth surface of said other surface to cover said at least one thru-silicon-via of each of said chip regions of said array of chip regions leaving dicing lines between each of said chip regions exposed; exposing the said smooth surface of said other surface to a roughening process to roughen said smooth surface along said dicing lines between each of said chip regions; removing said mask pattern; forming a layer of metal on said other surface; and removing metal from said layer of metal along said dicing lines between each of said chip regions.

In another embodiment of the present invention, a wafer structure is provided with an array of chip regions each having integrated circuits formed at one surface and at least one through via extending from said one surface to the other surface thereof, said other surface being roughened along the dicing lines between each of said chip regions of said array of chip regions and polished at said at least one through via of each of said chip regions. A layer of metal is formed on said other surface.

In another embodiment of the present invention, the above structure wherein said layer of material is a masking layer.

In yet another embodiment of the present invention, the above structure wherein said layer of material is a layer of metal.

In yet still another embodiment of the present invention, said layer of metal is patterned to leave gaps in the metal between said chip regions of said array of chip regions along said dicing lines.

In a further embodiment of the present invention, the wafer structure is diced into chips.

BRIEF DESCRIPTION OF THE DRAWING

FIGS. 1A-1F show a series of steps representing one way of forming a through via in a semiconductor structure.

FIGS. 4A-4J show a series of steps depicting the manner of forming, at the wafer level, the chip structure of FIG. 3.

DETAILED DESCRIPTION OF THE DRAWINGS

Figure 3:
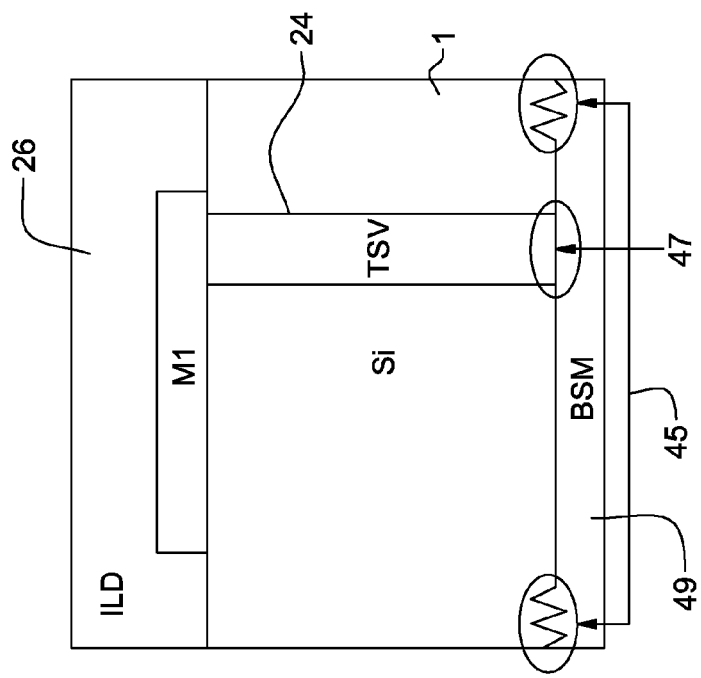
FIG. 3 shows a chip structure with roughened Si/BSM interface edges for adhesion and a smooth TSV/BSM interface for electrical performance, in accordance with the present invention.

Through via technology is typically employed for vertically connecting electrical devices to the next level of packaging. Where the packaging of electronic devices involves silicon semiconductor chips or wafers, or silicon semiconductor chip carriers, the vertical interconnection may be made by Thru-Silicon-Vias (TSV). The TSV structure has been found useful for improved density in packaging, such as applied to 3D integration. Semiconductor material other than silicon may, however, be similarly employed.

Although there are a variety of ways to obtain a through via, one effective approach is to use the "blind via" approach. In this approach, the vias are not etched through the wafer so that a "thru-via" is obtained only after the carrier is suitably thinned by grinding, for example, to expose the via bottom.

FIG. 1A shows a cross section of a semiconductor chip 1 with an opening 3 etched in photoresist mask layer 5, as formed on the chip. As shown, mask 5 is formed on oxide layer 7 which oxide layer is, in turn, formed on nitride layer 9. Contact openings 11 are formed in this oxide for connecting to device silicide contact layer 13. It should be understood that although FIG. 1A shows the structure at the chip level for the sake of convenience, the processing described here takes place at the wafer level so that TSVs are formed in the back side of the chips at the wafer level.

After forming opening 3 in resist mask 5, TSV 15, as shown in the cross section of FIG. 1B, is formed by etching. Opening 3 may be round shape, for example, and 1 to 10 μm in diameter. However, it is clear that other opening shape, such as a square shape, and sizes may as readily be employed. A deep reactive ion etch (RIE) method, for example, may be used here to form TSV 15. Thus, deep silicon etching by fluorine radicals generated in a plasma, as is known in the art, may be employed. As shown in FIG. 1B, etching is terminated prior to reaching the bottom surface 17 of semiconductor chip 1. Typically, the TSV depth would be about 10 to 200 μm. Although any of a variety of semiconductors may be used for chip 1, typically silicon would be used.

After forming TSV 15 in chip 1, the remainder of resist mask 5 is removed and liner 19 is conformally deposited in the via and on the oxide/nitride layers of the chip surface, as shown in FIG. 1C. The liner may, for example, be conductive metals like titanium, tantalum or tungsten, or compounds thereof, such as titanium nitride; or be electrically insulating materials like silicon oxide, silicon nitride, or combinations of the above mentioned conductive and insulating materials. The liner is then removed from the oxide/nitride layers on the chip by etching, and the TSV is filled with a conductive material, such as tungsten or copper, to form conductive via 21 of FIG. 1D. As shown in FIG. 1D, the conductive via material may not necessarily completely fill the via opening, as the central portion may have a void, as shown at 23. A plating process may be used to form conductive via 21.

After forming conductive via 21, inter-level dielectric (ILD) layer 25 with its various layers of metallurgy, such as layer 27, is formed on oxide layer 7, as shown in FIG. 1E. Back side grind tape 29 is then attached and the back side of chip 1 is ground to remove silicon and expose conductive via 21, as shown in FIG. 1E. Typically, such silicon removal may be achieved by, for example, grinding and/or TMAH etch. Other polishing steps, such as chemical-mechanical polishing and/or sputter cleaning, may be employed to provide a smooth surface.

As shown in FIG. 1F, the back side grind tape 29 is then removed and multilayer metal electrical contact structure, shown as back side metal (BSM) 31, is formed on the back side of chip 1. Typically, BSM uses several layers of metal, an example of which is shown in FIG. 2.

In the following description, specific details, such as specific metals, layers of metal and dimensions are set forth by way of example. It will be apparent to one skilled in the art that the present invention may be practiced without these specific details. In other instances, well known processing, such as associated with chemical vapor deposition (CVD), is not described in detail, in order not to unnecessarily obscure description of the present invention.

Figure 2:
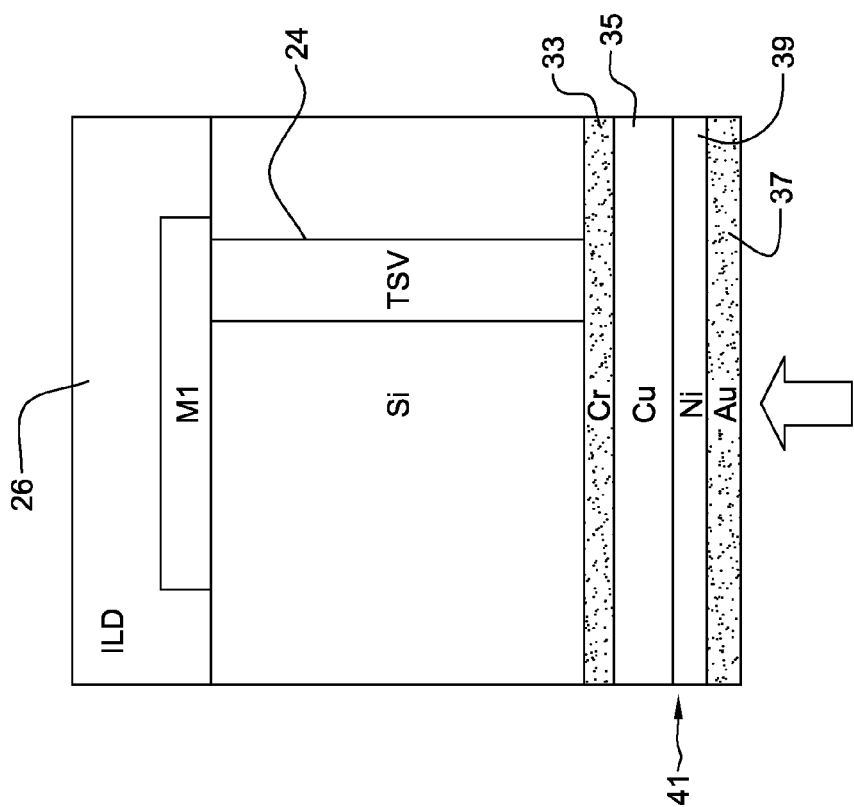
FIG. 2 shows a typical chip arrangement with metal layers of a multilayer metal electrical contact structure connected to a single TSV for the chip.

FIG. 2 shows a chip arrangement with four layers of metal for BSM structure 41 attached to TSV structure 24 which via is, in turn, connected to ILD 26. TSV 24 structure is shown in FIG. 2 as a solid metal conductor but may have a void in its interior portion, as described in FIG. 1. One arrangement for BSM structure 41 would be to employ an adhesion layer 33 of chromium of approximately 0.2 μm, a good conductivity layer 35 of copper of approximately 1 μm, an oxidation/corrosion resistant layer 37 of a nobel metal, such as gold, of approximately 0.1 μm and a layer of nickel 39 between the latter two to prevent interdiffusion between the copper and gold layers.

It has been observed, however, that delamination between the BSM structure and silicon die can occur at chip edges after dicing, even with a good adhesive layer, such as, layer 33 of chromium shown in FIG. 2. This has been observed in Cr/Cu/Cr/Ru and Cr/Cu/Ru stacks deposited on a polished silicon wafer surface, with or without sputter clean prior to BSM deposition. The scale of the observed delamination is on the order of 1 mm which creates serious reliability implications, considering that the typical chip size is on the order of millimeters.

However, it has also been observed that chip dicing induced BSM delamination has not occurred where BSM is deposited on wafers after wafer grinding without subsequent polishing steps. It appears that the surface roughness resulting from the wafer grinding process promotes adhesion between the silicon surface and BSM layer.

On the other hand, a rough BSM/TSV interface at the bottom of the TSV on the wafer backside may be problematic for good electrical contact to the BSM. In this regard, it has also been observed that damage to the bottom of the TSV structure results from wafer grinding. A polished TSV structure at the silicon wafer backside surface provides a good electrical contact.

FIG. 3 shows a chip structure wherein the silicon surface of silicon chip 1 is roughened at the edges, as shown by arrows 45 at chip edges, and is smooth at the bottom of TSV 24 structure and adjacent region or vicinity, as shown by arrow 47. Such structure acts to promote adhesion of BSM layer 49 at chip edges and yet the polished surface region at the bottom of and in the vicinity of TSV structure 24, as shown by arrow 47, allows good electrical contact between BSM layer 49 and TSV structure 24. It should be understood that the extent of the polished region at the TSV and surrounding region may be extended beyond what is shown by arrow 47. Thus, it may extend to the roughened region at chip edges. The extent of the roughen regions at chip edges, on the other hand, should be sufficient to prevent delamination and, thus, be extended from chip edge inwardly between 200 μm and about 1 mm.

Figure 4G:
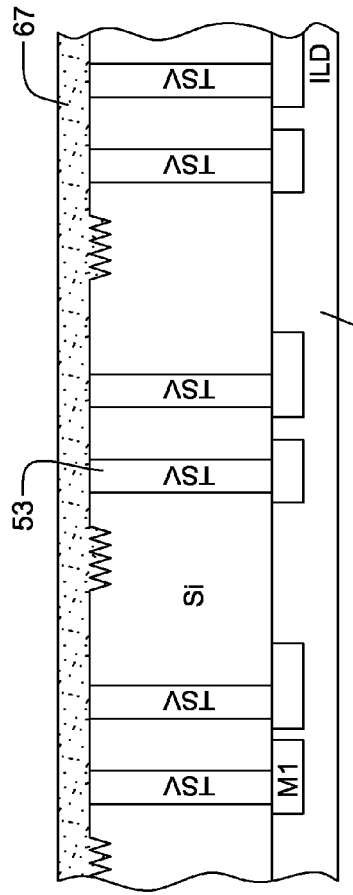

FIGS. 4A-4J show a series of process steps employed to fabricate the wafer and chip structure, in accordance with the present invention. FIG. 4A shows a cross-sectional view of a portion of silicon wafer 51 shown in a top view in FIG. 4B. It is noted that, for convenience of description, the following figures show ILD structure 26 (see FIGS. 2-3) flipped over so that the wafer backside is on top. The cross-sectional view of FIG. 4A shows two TSV structures 53 for each chip region (demarcated by dicing lines 59) with the TSVs connected to the M1 level of metallurgy in ILD 26. Similarly, FIG. 4B shows two TSV structures 53 for each chip region 55.

As shown in FIG. 4A, the back side silicon surface 57 is in a polished condition. Polishing is carried out after grinding away silicon to expose the TSV structures. Polishing may be carried out by any of a variety of technologies, such as, chemical-mechanical polishing.

FIG. 4C shows a cross-sectional view of the wafer structure shown in FIG. 4A with mask material 61 patterned to form a mask over the pair of TSVs shown for each chip region and expose the silicon at the chip edge regions. Conventional photoresist masking materials and techniques may be employed for this purpose.

As also shown by the downwardly pointing arrows in FIG. 4C, the wafer is subjected to an etching agent which roughens the polished silicon surface 57 at the chip edge regions while the mask protects the polished silicon surface in the regions of the TSV structures.

One process for roughening the silicon surface is to employ reactive ion etching (RIE) with RF to create a plasma using $C_4F_8$, CO and Ar. This acts to leave a Carbon/Fluorine (CFx) based polymer deposition on the wafers. Using the Huang A/B wets process where Huang A=$H_2O/H_2O_2/NH_4OH$ and Huang B=$H_2O/H_2O_2/HCl$, the wet solution aggressively reacts with the polymer deposited and dislodges some of the silicon imperfections. This causes massive pitting of the base silicon wafer. This process is common in semiconductor environments, although it is usually avoided as the results of pitting are detrimental in building the chip devices.

After roughening the silicon surface, mask material 61 is removed leaving a roughened surface in roughened surface regions 63 at chip edges, as shown in FIG. 4E. FIG. 4F shows a top view of the roughened surface regions 63 surrounding the polished surface region 65 shown within the squares.

Figure 4H:
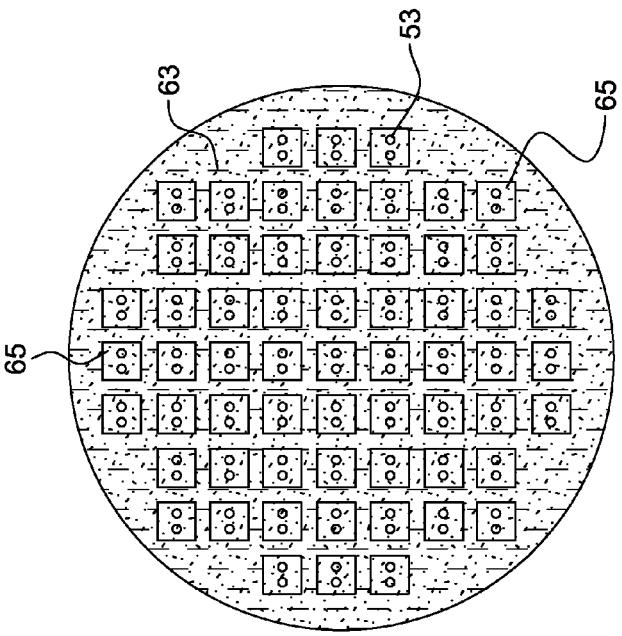

FIG. 4G shows the cross-sectional view of FIG. 4E with stippled BSM layer 67 deposited on the wafer backside with roughened and polished regions. BSM layer 67 may be any of a variety of BSM structures, such as, the structure shown in FIG. 2. Any of a variety of conventional of forming and deposition techniques may be used to form the BSM structure. FIG. 4H shows a top view of the wafer with roughened and polished regions 63 and 65, as covered by stippled BSM layer 67.

FIG. 4I-J show the wafer structure of FIG. 4G prepared for dicing along dicing lines 59. Any of a variety of techniques may be used for dicing the wafer into chips, as is well known to those skilled in the art.

Figure 5:
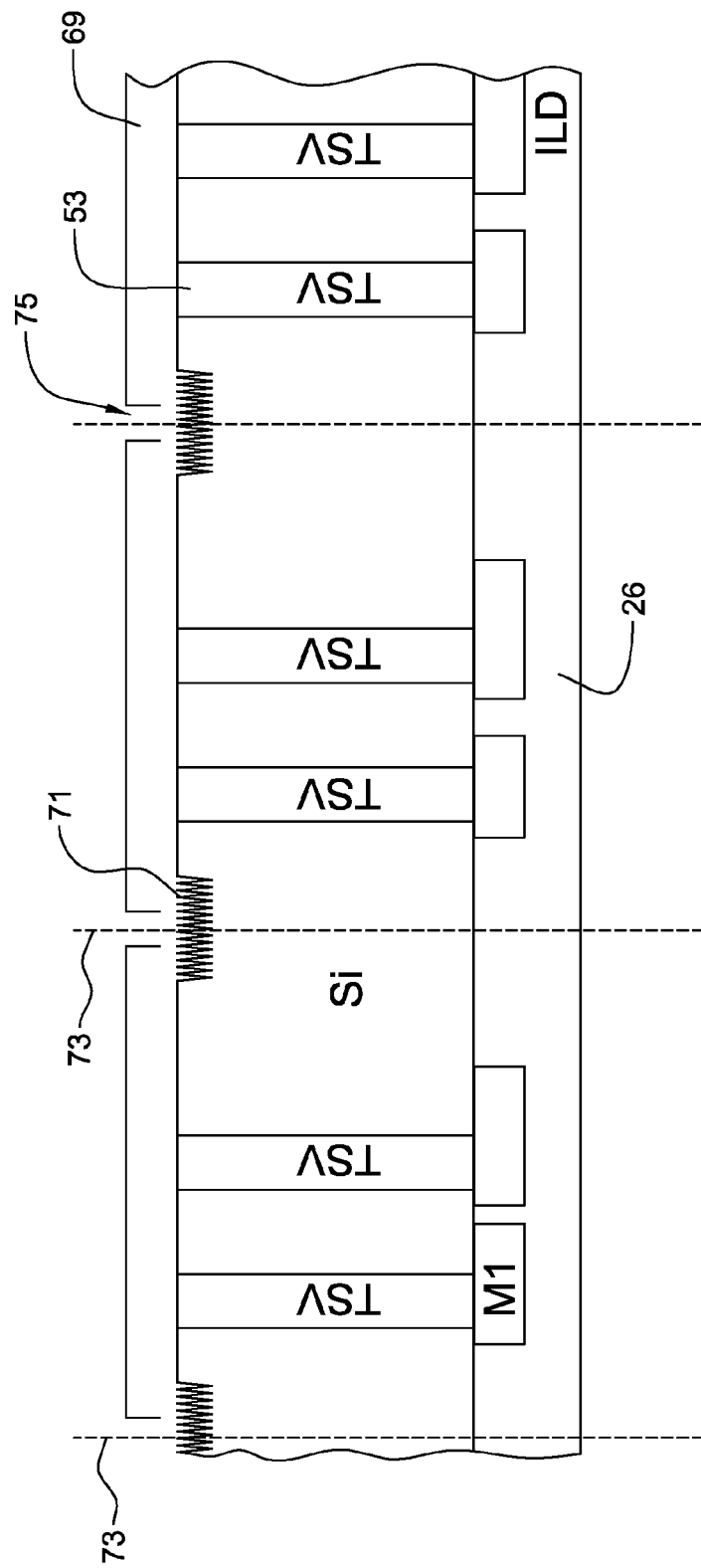
FIG. 5 shows an alternative embodiment for forming, at the wafer level, the chip structure of FIGS. 3 and 4.

FIG. 5 shows an alternative arrangement for forming the BSM layer on a roughened wafer, in accordance with the present invention. As shown in FIG. 5, BSM layer 69 is only formed over a portion of roughened chip edge regions 71 and on polished regions around the TSV structures 53 (akin to region 65 in FIG. 4E-4J). However, unlike FIG. 4I, before the dicing step described with regard to FIGS. 4I-4J, the BSM layer is etched back to the roughened silicon surface within roughened region 71 along dicing lines 73 to form gap 75, as shown in FIG. 5.

The gap 75, formed by etching within the roughened region 71, permits cutting along the dicing lines without the need to mechanically intrude BSM layer 69 and the BSM layer/silicon interface, thus reducing mechanical stress and fracture. This stress avoidance further reduces the possibility of delamination. Etching gap 75 may be carried out by, for example, patterning a photoresist mask over the BSM regions shown in FIG. 5, and then etching the gap using RIE or wet etching to the roughened silicon.

Although not shown, it is clear that a top view of the wafer would show gap 75 in both the horizontal and vertical direction along the dicing lines delineating the array of chip regions, akin to regions 65 as shown in FIG. 4F. Thus, by this alternative embodiment, the process of FIGS. 4A-G is extended further steps to form gap 75 in the BSM layer before dicing. Although gap 75 is shown being open to the roughened silicon surface, it is clear that benefits would be obtained by etching the gap to less than the roughened silicon.

It is clear that it is also possible to not polish the roughened backside wafer surface that results from backside wafer grinding to expose the TSVs and then only polish the surface of the TSV structures and vicinity. This could be achieved by patterning a mask on the roughened backside wafer surface along the dicing lines and leaving the TSV structures and vicinity exposed for polishing, as RIE or sputter cleaning, for example.

It will be understood from the foregoing description that various modifications and changes may be made in the preferred embodiment of the present invention without departing from its true spirit. It is intended that this description is for purposes of illustration only and should not be construed in a limiting sense. The scope of this invention should be limited only by the language of the following claims.

What is claimed is:

1. A method of preventing a layer of material from delaminating from a semiconductor surface, comprising:
   providing a layer of semiconductor material having opposing surfaces with at least one through via structure extending to at least one of said opposing surfaces;
   providing a roughened surface region on said at least one of said opposing surfaces beyond said at least one through via structure to promote adhesion of said layer of material to said at least one of said opposing surfaces; and
   forming said layer of material on said at least one of said opposing surfaces.

2. The method of claim 1 wherein said layer of material is a layer of metal and said at least one through via structure and vicinity thereof within said roughened surface region is polished.

3. The method of claim 2 wherein said layer of semiconductor material is a semiconductor wafer having an array of chips each having said at least one via structure extending to said at least one surface and said step of providing a roughened surface region is carried out along chip dicing lines of said wafer beyond said via structures.

4. The method of claim 3 wherein said at least one of said opposing surfaces is polished and said step of providing a roughened surface region is carried out by forming masks over at least said at least one through via structure and vicinity thereof leaving said chip dicing lines exposed and exposing said chip dicing lines to a roughening agent.

5. The method of claim 4 wherein the said at least one of said opposing surfaces is roughened throughout and said at least one through via structure and vicinity thereof is polished by forming masks over said roughened surface region along said chip dicing lines leaving said at least one through via structure and vicinity exposed and exposing said roughened surface of said at least one through via structure and vicinity thereof to a polishing agent.

6. The method of claim 5 wherein said step of exposing said chip dicing lines to a roughening agent includes exposing said chip dicing lines to reactive ion etching.

7. The method of claim 6 wherein said reactive ion etching is followed by wet etching.

8. The method of claim 7 wherein said at least one of said opposing surfaces is polished by chemical-mechanical polishing.

9. The method of claim 3 wherein said layer of metal is formed with gaps in said metal between said chips along said chip dicing lines of said wafer.

10. The method of claim 9 wherein said semiconductor wafer is diced along said chip dicing lines.

11. A method of improving metal adhesion in chip fabrication, comprising:
    providing a semiconductor wafer with an array of chip regions each having integrated circuits formed at one surface and at least one through via extending from said one surface to the other surface thereof;
    polishing the said other surface of said wafer to a smooth surface;
    forming a mask pattern on the said smooth surface of said other surface to cover said at least one through via of each of said chip regions of said array of chip regions leaving dicing lines between each of said chip regions exposed;
    exposing said dicing lines of said smooth surface of said other surface to a roughening process to roughen said smooth surface along said dicing lines between each of said chip regions while allowing said mask pattern to prevent roughening of said at least one through via of each of said chip regions of said array of chip regions;
    removing said mask pattern; and
    forming a layer of metal on said other surface.

12. The method of claim 11 wherein said polishing of said other surface includes chemical-mechanical polishing.

13. The method of claim 11 wherein said roughening process includes exposing said dicing lines of said smooth surface of said other surface to reactive ion etching in plasma using $C_4F_8$, CO and Ar.

14. The method of claim 13 wherein said reactive ion etching step is followed by wet etching.

15. The method of claim 14 wherein said wafer is diced along said dicing lines.

16. A method of improving chip edge adhesion in thru-silicon-via structures, comprising:
    providing a silicon wafer having an array of chip regions each having integrated circuits formed at one surface and at least one thru-silicon-via structure extending from said one surface to a smooth surface of the other surface thereof with said at least one thru-silicon-via structure at least partially filled with a conductive material extending to the said smooth surface of said other surface thereof of said silicon wafer;
    forming a mask pattern on the said smooth surface of said other surface to cover said at least one thru-silicon-via of each of said chip regions of said array of chip regions leaving dicing lines between each of said chip regions exposed;

exposing the said smooth surface of said other surface to a roughening process to roughen said smooth surface along said dicing lines between each of said chip regions;

removing said mask pattern;

forming a layer of metal on said other surface; and removing metal from said layer of metal along said dicing lines between each of said chip regions.

17. The method of claim 16 wherein said roughening process includes exposing said smooth surface of said other surface to reactive ion etching in plasma using $C_4F_8$, CO and Ar and then follow by wet etching.

18. The method of claim 17 wherein said wafer is diced along said dicing lines.

* * * * *